United States Patent
Piechocinski

(10) Patent No.: US 9,926,189 B2
(45) Date of Patent: Mar. 27, 2018

(54) MEMS DEVICE AND PROCESS

(71) Applicant: Cirrus Logic International Semiconductor Ltd., Edinburgh (GB)

(72) Inventor: Marek Sebastian Piechocinski, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/413,608

(22) Filed: Jan. 24, 2017

(65) Prior Publication Data

US 2017/0217760 A1     Aug. 3, 2017

Related U.S. Application Data

(60) Provisional application No. 62/288,097, filed on Jan. 28, 2016.

(30) Foreign Application Priority Data

Mar. 14, 2016    (GB) .................................. 1604303.6

(51) Int. Cl.
     *H04R 7/26*        (2006.01)
     *B81B 7/00*        (2006.01)
     *B81C 1/00*        (2006.01)
     *H04R 19/04*       (2006.01)
     *G01L 9/00*        (2006.01)

(52) U.S. Cl.
     CPC ........ *B81B 7/0061* (2013.01); *B81C 1/00158* (2013.01); *G01L 9/0073* (2013.01); *H04R 7/26* (2013.01); *H04R 19/04* (2013.01); *B81B 2201/0257* (2013.01); *B81B 2201/0264* (2013.01); *B81B 2203/0118* (2013.01); *B81B 2203/0127* (2013.01);

(Continued)

(58) Field of Classification Search
     CPC .......... B81B 7/0061; B81B 2203/0127; B81B 2207/012; B81B 2201/0257; B81B 2203/0018; B81B 2203/0323; B81B 2201/0264; G01L 9/0073; H04R 19/04; H04R 2201/003; H04R 7/26; B81C 1/00158
See application file for complete search history.

(56) References Cited

U.S. PATENT DOCUMENTS

| | | |
|---|---|---|
| 2013/0223023 A1 | 8/2013 | Dehe et al. |
| 2014/0084396 A1 | 3/2014 | Jenkins et al. |
| 2015/0041931 A1 | 2/2015 | Szczech et al. |

FOREIGN PATENT DOCUMENTS

| | | |
|---|---|---|
| GB | 2506979 A | 4/2014 |
| GB | 2533410 A | 6/2016 |

OTHER PUBLICATIONS

Combined Search and Examination Report under Sections 17 and 18(3), Application No. GB1604303.6, dated Sep. 13, 2016, 7 pages.

(Continued)

*Primary Examiner* — Joseph C Nicely
*Assistant Examiner* — Pavel Ivanov
(74) *Attorney, Agent, or Firm* — Jackson Walker L.L.P.

(57) ABSTRACT

The application describes MEMS transducers and associated methods of fabrication. The MEMS transducer has a flexible membrane with a vent structure comprising a moveable portion which opens in response to a differential pressure across the membrane to provide a flow path through the membrane. At least one edge of the moveable portion comprises one or more protrusions and/or recesses in the plane of the moveable portion.

46 Claims, 11 Drawing Sheets

(52) U.S. Cl.
CPC . *B81B 2203/0323* (2013.01); *B81B 2207/012* (2013.01); *H04R 2201/003* (2013.01)

(56) References Cited

OTHER PUBLICATIONS

International Search Report and Written Opinion of the International Searching Authority, International Application No. PCT/GB2017/050165, dated Apr. 6, 2017.

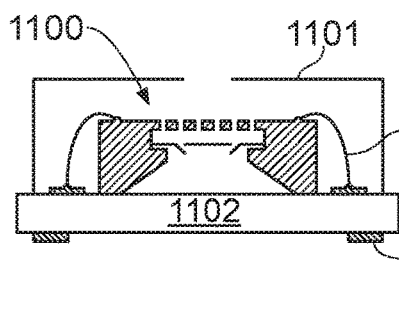
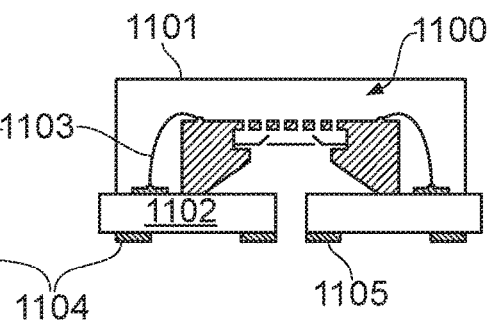
FIG. 13a     FIG. 13b
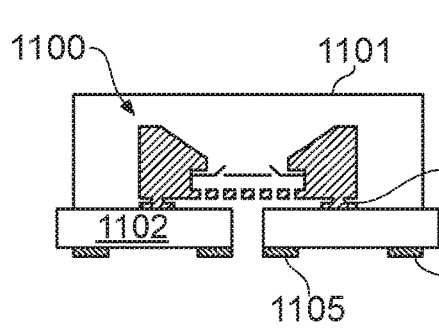
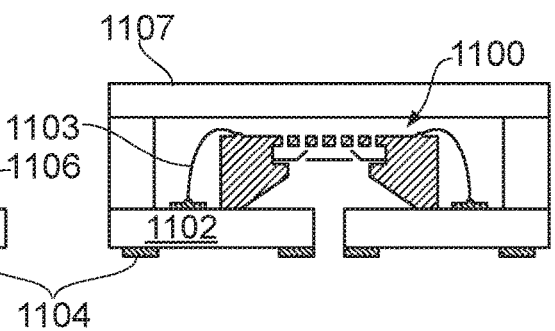
FIG. 13c     FIG. 13d
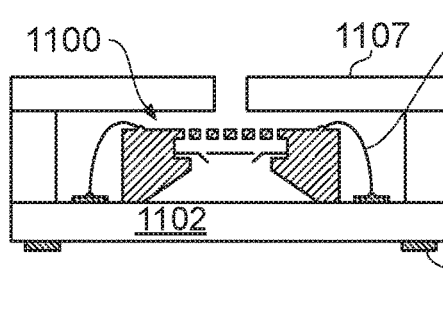
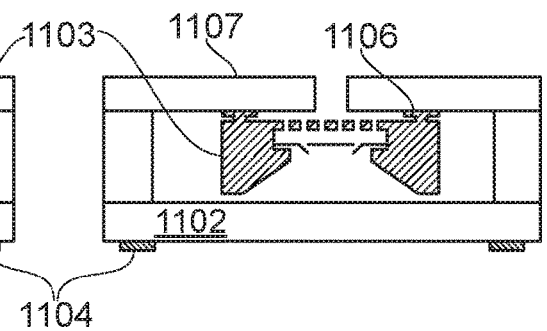
FIG. 13e     FIG. 13f
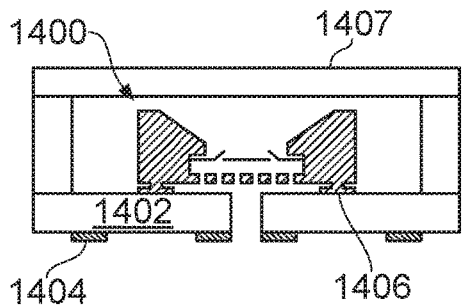
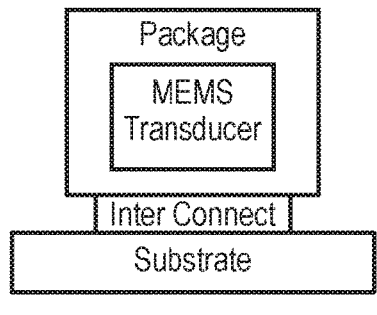
FIG. 13g     FIG. 13h

MEMS DEVICE AND PROCESS

FIELD OF DISCLOSURE

This invention relates to a micro-electro-mechanical system (MEMS) device and process, and in particular to a MEMS device and process relating to a transducer, for example a capacitive microphone.

BACKGROUND

Various MEMS devices are becoming increasingly popular. MEMS transducers, and especially MEMS capacitive microphones, are increasingly being used in portable electronic devices such as mobile telephones and portable computing devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between a pair of electrodes which will vary as the distance between the electrodes changes in response to sound waves incident on the membrane surface.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

The first cavity 109 may be formed using a first sacrificial layer during the fabrication process, i.e. using a material to define the first cavity which can subsequently be removed, and depositing the membrane layer 101 over the first sacrificial material. Formation of the first cavity 109 using a sacrificial layer means that the etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

A plurality of holes, hereinafter referred to as bleed holes 111, connect the first cavity 109 and the second cavity 110.

As mentioned the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required flexibility whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

In some applications, the microphone may be arranged in use such that incident sound is received via the back-plate. In such instances a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to freely move between the second cavity and a further volume above the back-plate.

It should also be noted that whilst FIG. 1 shows the back-plate 104 being supported on the opposite side of the membrane to the substrate 105, arrangements are known where the back-plate 104 is formed closest to the substrate with the membrane layer 101 supported above it.

In use, in response to a sound wave corresponding to a pressure wave incident on the microphone, the membrane is deformed slightly from its equilibrium position. The distance between the lower electrode 102 and the upper electrode 103 is correspondingly altered, giving rise to a change in capacitance between the two electrodes that is subsequently detected by electronic circuitry (not shown). The bleed holes allow the pressure in the first and second cavities to equalise over a relatively long timescales (in acoustic frequency terms) which reduces the effect of low frequency pressure variations, e.g. arising from temperature variations and the like, but without impacting on sensitivity at the desired acoustic frequencies.

The transducer shown in FIG. 1 is illustrated with substantially vertical side walls supporting the membrane layer 101 in spaced relation from the back-plate 104. Given the nature of the deposition process this can lead to a high stress concentration at the corners formed in the material layer that forms the membrane. Sloped or slanted side walls may be used to reduce the stress concentration. Additionally or alternatively it is known to include a number of support structures such as columns to help support the membrane in a way which reduces stress concentration. Such columns are formed by patterning the first sacrificial material used to define the first cavity 109 such that the substrate 105 is exposed in a number of areas before depositing the material forming the membrane layer 101. However, this process can lead to dimples in the upper surface of the back-plate layer in the area of the columns.

MEMS transducers such as those shown in FIG. 1 may usefully be used in a range of devices, including portable devices. Especially when used for portable devices it is desirable that the MEMS transducers are sufficiently rugged to survive expected handling and use of the device. There is therefore a general desire to improve the resilience of MEMS devices.

Thus, to be useful for use in portable electronic devices such transducers should be able to survive the expected handling and use of the portable device, which may include the device being accidentally dropped.

If a device such as a mobile telephone is subject to a fall, this can result not only in a mechanical shock due to impact but also a high pressure impulse incident on a MEMS transducer. For example, a mobile telephone may have a sound/acoustic port for a MEMS microphone on one face of the device. If the device falls onto that face, some air may be compressed by the falling device and forced into the sound port. This may result in a high pressure impulse incident on the transducer. It has been found that in conventional MEMS transducers of the form described above high pressure impulses can potentially lead to damage of the transducer.

The sacrificial material used to define the first and second cavities is dimensioned so as to provide a desired equilibrium separation between the membrane layer 101 and the substrate 105 and also between the membrane layer 101 and the back-plate 104 so as to provide good sensitivity and dynamic range in use. In normal operation the membrane may deform within the volume defined by the first and second cavities without contacting the back-plate and/or substrate 105.

In response to a high pressure impulse however the membrane layer 101 may exhibit a greater amount of deformation than usual. FIG. 2a illustrates the situation where the membrane has been deformed downwards following a high pressure event and FIG. 2b shows the situation where the membrane has been displaced upwards.

Consider the situation where the microphone is arranged to receive incident sound from a sound port arranged above the back-plate 104 and the sound port pressure suddenly increases, for instance as a result of air trapped when the device falls being forced into the sound port. This may result the pressure in the second cavity 110 being significantly greater than the pressure in the first cavity 109, displacing the membrane downwards to greater extent than is usual. This may result in a relatively large stress at point 301 where membrane layer 101 forms part of the sidewall of supporting structure 201 and, in some instances, may thus result in delamination of the membrane layer from the rest of the sidewall structure. Further, if the pressure difference is great enough the membrane may make contact with the substrate 105 at the edge of the substrate defined by the side wall 202 of the opening of substrate cavity 108. Typically the edge of the substrate at the location of the opening of substrate cavity has a relatively sharp angle and thus the membrane may be deformed round this edge, leading to a large stress concentration at this point 302.

As mentioned previously the membrane layer 101 will typically be formed from one or more thin layers of semiconductor material, such as silicon nitride. Whilst such a material can be flexible when subject to even stresses if there is a significant localised out-of-plane stress, such as may be introduced into the membrane at point 302 by contact with the edge of the opening of substrate cavity 108, the membrane material can be relatively brittle. Thus contact between the membrane and the edge of the opening of substrate cavity in this way can lead to damage such as cracking of the membrane.

The bleed holes discussed above with relation to FIG. 1 will provide a flow path between the first and second cavities and thus flow of air through the bleed holes will reduce the pressure differential acting on the membrane over time. However the bleed holes are typically deliberately arranged to provide a limited amount of flow so as to provide a desired frequency response. Thus a high pressure differential may be maintained across the membrane for a relatively long period of time before flow through the bleed holes acts to equalise the pressures in the first and second cavities. The time taken to equalise via the bleed holes could be changed by altering the size and/or number of bleed hole but this may impact negatively on transducer performance.

As the high pressure caused by trapped air may persist for a relatively long time, the pressure in the first and second cavities may equalise by virtue of the bleed holes as discussed. Thus the pressure in the first cavity, and substrate cavity, may increase until the pressures are equalized. However once air is no longer being forced into the sound port the pressure in the sound port will reduce quite quickly and, as typically the back-plate has a low acoustic impedance, the pressure in the second cavity will quickly reduce. At this point the pressure in the first cavity may be significantly greater than the pressure in the second cavity and thus the membrane may be deformed upwards, again to a greater extent than may usually be in the case. Again this may lead to a significant stress in region 301 where the membrane layer 101 meets the sidewall of the supporting structure. If the pressure difference is large enough the membrane may be displaced far enough to contact the back-plate 104. This may limit the amount of travel of the membrane as compared with the situation shown in FIG. 2a but again this may introduce stress into the membrane layer at the point 303 where it contacts the back-plate 104. Again it may take a while for this pressure differential to reduce by virtue of flow through the bleed holes.

It should be appreciated that both of these situations can also occur when sound is received via the substrate cavity 108 but in the opposite order.

FIGS. 3a to 3c show a previously proposed MEMS transducer comprising a flexible membrane 101 and a variable vent structure 401 in the form of a moveable portion or "flap" 402. The moveable flap portion is defined by a thin channel 403 which runs through the membrane and partially separates the moveable flap portion from the rest of the membrane whilst remaining attached to the rest of the membrane via a connecting portion 404.

The moveable flap portion 402 is arranged such that its equilibrium position—i.e. the position it adopts with substantially no pressure differential acting on the moveable portion, is within the plane of the membrane. In response to a pressure differential across the moveable portion of the vent structure the moveable portion is deflected away from the plane of the membrane so as to expose a hole in the membrane. In this way, the size of a flow path through the vent structure between a first volume above the membrane to a second volume below the membrane is varied in response to a variable pressure differential acting on the moveable portion.

FIG. 3b illustrates in perspective view the part of the membrane and the variable vent. In this example the pressure in the volume below the membrane is sufficiently greater than the pressure in the volume above the membrane such that the moveable flap portion 402 has been deflected upwards away from the rest of the membrane surface. This opens the flow channel through the membrane, i.e. effectively opens a hole in the substrate. If the pressure differential increases enough the moveable portion 402 may be further deflected and thus provide a greater amount of opening, i.e. a greater flow path.

The moveable portion may thus adopt a range of positions. These positions depend on the pressure differential acting on the moveable portion (or the variable vent). The extent to which the moveable portion is deflected also determines how much the moveable portion blocks/exposes the hole through the membrane and thus the size of the flow path.

The structure shown in FIG. 3 has been shown to act so to reduce the pressure differential acting on the membrane at relatively high pressure differentials. However, pressure impulse profiles arising as a result of e.g. air being forced into the sound port of a host device due to an impact, can often peak within a few milliseconds. Thus, unless the vent structure can respond quickly, ideally within this time range, damage may still be sustained by a high pressure or over-pressure event.

SUMMARY

The present invention is concerned with improving the resilience of MEMS devices to a high pressure impulse incident on a MEMS transducer. In particular, the present invention seeks to improve the response time of a vent structure provided on a flexible membrane of a MEMS transducer. Thus, the present invention seeks to facilitate an equalization of a pressure differential arising between the upper and lower surfaces of the membrane.

According to an aspect of the present invention there is provided a MEMS transducer comprising: a flexible membrane having a vent structure, the vent structure comprising a moveable portion which is separated from the rest of the membrane by a channel which extends through the membrane and defines a pair of adjacent internal edges, wherein at least one of the internal edges is provided with one or more protrusions or recesses.

Thus, according to embodiments of the present invention, an internal edge (which is distinguished from a boundary edge of the membrane) is interrupted by one or more discontinuities, such as protrusions and/or recesses, which extend and/or retreat in the plane of the membrane. Thus, the edge can be considered to be serrated or indented, or may be considered to comprise a plurality of discrete, protruding, elements. Thus, the edge can be considered to exhibit a profile, or shape, that varies within the plane of the moveable portion.

Preferably, but not necessarily, the edge that is provided with a plurality of protrusions and/or recesses, is an edge of a moveable portion or "flap" that is defined by the channel. Alternatively, or additionally, the edge that is provided with a plurality of protrusions and/or recesses, is an edge of the rest of the membrane.

According to another aspect of the present invention there is provided a MEMS transducer comprising: a flexible membrane, the flexible membrane having a vent structure comprising a moveable portion, wherein in response to a differential pressure across the vent structure, the moveable portion deflects away from the plane of the membrane, and wherein an edge of the moveable portion is provided with one or more protrusions and/or recesses in the plane of the moveable portion.

At the equilibrium position, the edge comprising one or more protrusions or recesses may preferably be complimentary in shape to the shape of the edge of an adjacent moveable portion, or complimentary to the shape of an adjacent edge of the membrane.

The membrane is a flexible, thin film membrane. The membrane is generally planar in shape and is formed from one or more thin layers of semiconductor material, such as silicon nitride. The moveable portion may be defined by one or more channels which extend through the membrane except at a connecting portion. These channels are formed during the fabrication of the MEMS transducer by a process of selective etching. Thus, the moveable portion may be formed from the same material as the semiconductor material.

The flexible membrane exhibits an equilibrium position which can be considered to correspond to the minimum size of the flow path through the flexible membrane. Thus, at the equilibrium position, the differential pressure across the vent structure is insufficient to cause deflection of the moveable portion and the size of the flow path through the membrane is minimal/negligible.

It will of course be appreciated that the channel does represent a path for air to flow through the membrane, however the channel may be formed with a very narrow width and thus there may be no or limited air flow through the channel when the vent structure is in the equilibrium position at which the moveable portion(s) substantially close/cover the aperture.

In response to a differential pressure across the moveable portion of the vent structure the moveable portion deflects to reveal an aperture in the flexible membrane and, thus, to provide a flow path through the flexible membrane. This facilitates an equalisation of the pressure acting on the opposing surfaces of the membrane and tends to restore the moveable portion to its equilibrium position. As will be explained in more detail, the provision of one or more protrusions and/or recesses on an internal edge of the membrane and/or moveable portion may be seen to increase the initial rate at which the vent opens in response to a differential pressure across the membrane.

The protrusions and/or recesses may be any shape. For example, the edge may exhibit a sinusoidal, a square-wave, triangle-wave, or saw-tooth profile. Alternatively, the edge could exhibit a serrated or notched form. The protrusions and/or recesses may be provided at regular intervals along the edge or may be provided irregularly. The periodicity and/or the amplitude of the protrusions and/or recesses may by uniform or may vary along a given edge.

The vent structure may typically comprises a plurality of moveable portions. In this case first and second adjacent edges of adjacent moveable portions may be shaped so as to exhibit a non-linear profile and/or to comprise one or more protrusions and/or recesses. The first adjacent edge may exhibit a shape that is generally complimentary to the shape of the second adjacent edge when the moveable portions are at the equilibrium position. The first and second adjacent edges may be considered to comprise interdigitated edges.

It will be appreciated that the moveable portions of the vent structure may be of any shape including circular, triangular, square, and rectangular. Alternatively the moveable portion may comprise an irregular polygon. The shape of the moveable portion(s) may depend on the shape of the aperture that will be revealed when the vent deflects in response to a differential pressure. Thus, that, at the equilibrium position when the moveable portions are in plane with the rest of the membrane, the moveable portion substantially cover/close the aperture. For example, a vent structure comprising two or more moveable portions may be configured such that the moveable portions tessellate with each other at the equilibrium position.

According to another aspect of the present invention there is provided a MEMS transducer comprising: a flexible membrane, the flexible membrane having a vent structure comprising a plurality of moveable portions, wherein in response to a differential pressure across the vent structure, the moveable portions deflect away from the plane of the membrane to reveal an aperture in the membrane, the vent structure having an equilibrium position at which the moveable portions are substantially in plane with the rest of the membrane and at which first and second adjacent edges of two adjacent moveable portions are aligned, wherein the first and second adjacent edges are provided with one or more protrusions and/or recesses such that the first adjacent edge exhibits a shape that is complimentary to the shape of the second adjacent edge when the moveable portions are at the equilibrium position.

The provision of one or more protrusions and or recesses in an edge of the moveable portion extends the length of the edge of the moveable portion, as compared to the corresponding uninterrupted, or continuous, length between the end points of a given edge. The "end point" of an edge may be considered to be the point at which the general/overall direction of the channel changes (ignoring any changes in direction caused by the protrusions and/or recesses). In response to a high pressure event, which causes the moveable portion to deflect away from the plane of the membrane, this extended edge length can be considered to provide a larger vertical surface area on which the resultant force of a pressure differential across the vent will act during the initial stages of the vent structure opening. The extended edge length beneficially increases the initial vent opening speed, therefore allowing a faster pressure equalisation and improving the resilience of the transducer. Preferably, the one or more protrusions and/or recesses increase the internal edge length by between 25% and 50%, or more preferably by at least 50% with respect to the equivalent uninterrupted edge length.

During fabrication of a MEMS transducer according to any of the above aspects, one or more channels are etched through the flexible membrane to define the, or each, moveable portion and to separate the/each moveable portion from the rest of the membrane, except at a connecting portion. The channel(s) therefore define one or more pairs of internal edges of the membrane. The shape of the moveable portion, including the shape or profile of the internal edge, is therefore defined by the etching process. In this way, according to an aspect of the present invention, two substantially complimentary edges are formed either side of a channel or gap. The channel may exhibit a width of less than 1 µm and preferably in the region of 0.35 µm.

The two substantially complimentary internal edges may be defined between adjacent moveable portions of the vent structure, or between an edge of a moveable portion and an adjacent edge of the membrane. Preferably, the two complimentary edges are provided at a region of the moveable portion where the most deflection of the moveable portion is expected to occur in response to e.g. a high pressure event. It will be appreciated that the region of most expected deflection will depend on the design of the vent structure.

According to a particularly preferred embodiment, the density of protrusions and/or recesses provided on an internal edges may be varied such that the density is higher in a region of most expected deflection. This arrangement beneficially enhances the non-linear, variable response, of the vent structure.

According to another aspect of the invention there is provided a MEMS transducer comprising: a flexible membrane, the flexible membrane having a vent structure comprising a moveable portion which is separated from the rest of the membrane by a channel which extends through the membrane and defines at least one internal edge of the moveable portion, the channel defining a meandering path between first and second endpoints of the channel.

Thus, the channel may define a path which meanders between first and second endpoints of the channel or which is exhibits a plurality of discontinuities or interruptions.

The shape of the/each moveable portion is defined by a particular number of internal edges. For example, a vent structure having a single, circular-shaped, moveable portion can be defined by one internal edge. Alternatively, the moveable portion may be an irregular polygon and therefore bounded by a plurality of internal edges. It will be appreciated that the protrusions and/or recesses may be provided on at least a part of one or more of the internal edges formed either side of the channel which defines the moveable portion.

The channel may be considered to define two adjacent, complimentary or interdigitated edges. Thus an interdigitated region or volume is provided between the first adjacent internal edge of the moveable portion and the second adjacent edge (which may be of the membrane or of another, adjacent moveable portion of the vent structure).

The vent structure of a MEMS transducer may comprise a plurality of moveable portions which are connected to the outer periphery of the vent aperture and which are lay in the plane of the aperture at the equilibrium position. First and second interdigitated edges are preferably provided adjacent to one another on two of the plurality of moveable portions. Preferably, at the equilibrium position the first and second interdigitated edges are provided at a region of the channel where the most deflection of the moveable portion is expected to occur in response to a differential pressure across the membrane.

According to another aspect of the present invention there is provided a MEMS transducer comprising a vent structure for overpressure equalisation wherein at least one of the internal edges of the vent structure is provided with one or more protrusions or recesses.

According to another aspect of the present invention there is provided a MEMS transducer comprising an overpressure vent structure wherein at least one of the internal edges of the vent structure is provided with one or more protrusions or recesses.

According to another aspect of the present invention there is provided an over-pressure vent structure for a MEMS transducer wherein at least one of the internal edges of the vent structure is provided with one or more protrusions or recesses.

According to another aspect of the present invention there is provided a method of fabricating a MEMS transducer having a flexible membrane, the method comprising: forming a structure having a flexible membrane supported between a first volume and a second volume; and forming at least one vent structure in communication with at least one of said first and second volumes, comprising forming at least one channel which extends through the membrane to define at least one moveable portion which can be deflected away from the surface of the rest of the flexible membrane in response to a pressure differential, said channel defining a pair of adjacent internal edges, wherein at least one of the internal edges is provided with one or more protrusions and/or recesses in the plane of the membrane.

In general there is provided a MEMS transducer that comprises at least one vent structure provided in a flexible membrane of the transducer. The MEMS transducer may be a capacitive microphone. The flexible membrane may be supported between a first volume and a second volume and a flow path may be provided between the first and second volumes by means of the vent. The vent structure may comprise a moveable portion which is moveable so as to open a hole extending from the first volume to the second volume. The moveable portion may quiescently occupy at least some, and possibly most, of the area of the hole, but is moveable in response to a local pressure differential across the hole so as to vary the size of the hole which is open to provide a flow path. In other words the moveable portion may, in equilibrium, effectively close at least part of the hole, but is moveable so as to vary to degree to which the hole is closed. The moveable portion is preferably arranged to remain closing the hole, i.e. aperture, at normal operating pressure differentials but to more to increase the size of the flow path, e.g. close less of the hole, at higher pressure differentials that could potentially cause damage to the membrane. The vent can therefore be seen as a variable aperture.

The vent structure thus acts as a type of pressure relief valve to reduce the pressure differential acting on the membrane. However unlike, the bleed holes in the membrane (if present) which have a fixed area and thus a fixed size of flow path, the variable vent has a flow path size, i.e. aperture, which varies in response to a pressure differential. Thus the degree to which the vent allows venting depends on the pressure differential acting on the vent—which clearly depends on the pressure of at least one of the first and second volumes. The vent structure therefore provides a variable acoustic impedance.

The transducer may comprise a back-plate structure wherein the flexible membrane layer is supported with respect to said back-plate structure. The back-plate structure may comprises a plurality of holes through the back-plate structure. When at least one vent structure is formed in the flexible membrane layer at least one of the holes through the back-plate structure may comprise a vent hole in a location that corresponds to the location of a vent structure in the flexible membrane layer. The area of the vent hole in the back-plate may extend laterally away from the area of opening of the vent in the flexible membrane at a position where the variable vent in the flexible membrane first opens. When at least one vent structure is formed in the flexible membrane layer and comprises a moveable portion which is connected to the rest of the membrane via a beam structure and the moveable portion and beam structure are defined by channels running through the flexible membrane; then the location of the channels in the membrane which do not form part of the variable flow path through the membrane in use may be arranged so as to not substantially overlap with the location of any of said plurality of holes in the back-plate structure.

The transducer may be a capacitive sensor such as a microphone. The transducer may comprise readout circuitry (analogue and/or digital). The transducer and circuitry may be provided together on a single semiconductor chip—e.g. an integrated microphone. Alternatively, the transducer may be on one chip and the circuitry may be provided on a second chip. The transducer may be located within a package having a sound port, i.e. an acoustic port. The transducer may be implemented in an electronic device which may be at least one of: a portable device; a battery powered device; an audio device; a computing device; a communications device; a personal media player; a mobile telephone; a tablet device; a games device; and a voice controlled device.

Features of any given aspect may be combined with the features of any other aspect and the various features described herein may be implemented in any combination in a given embodiment.

Associated methods of fabricating a MEMS transducer are provided for each of the above aspects.

BRIEF DESCRIPTION OF THE DRAWINGS

The invention will now be described by way of example only with reference to the accompanying drawings, in which:

FIGS. 13a to 13h illustrate various MEMS transducer packages.

DETAILED DESCRIPTION

Embodiments of the present invention relate to MEMS transducers comprising a transducer structure comprising a flexible membrane supported between a first volume and a second volume. The first volume may for instance comprise the first cavity 109 between the membrane and the substrate and/or the volume formed in the substrate 108. The second volume may comprise the second cavity 110 between the membrane and back-plate and/or any volume in fluid communication with the second cavity (e.g. a sound port in top-port embodiments).

Figure 1A:
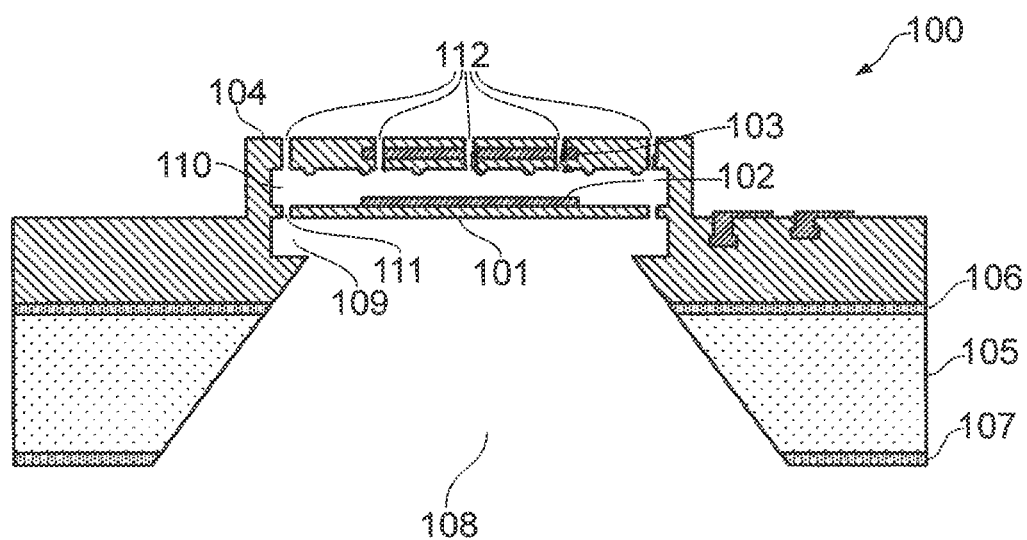
FIGS. 1a and 1b illustrate known capacitive MEMS transducers in section and cut-away perspective views.
Figure 1B:
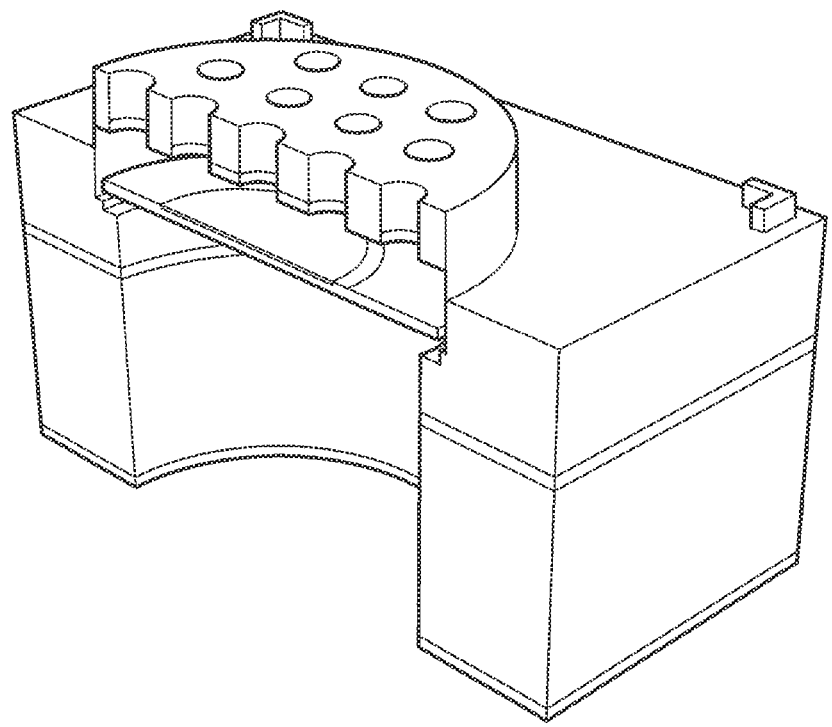
Figure 2A:
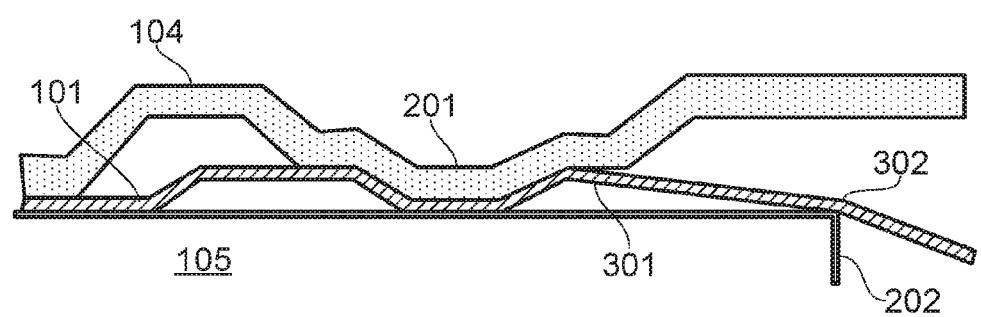
FIGS. 2a and 2b illustrate how a high pressure event may affect the membrane
Figure 2B:
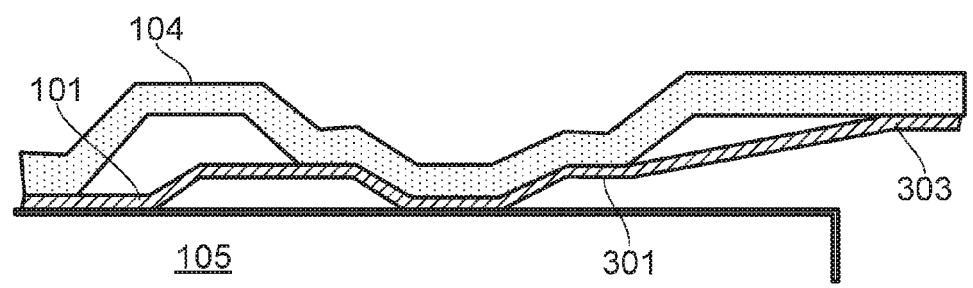
Figure 3A:
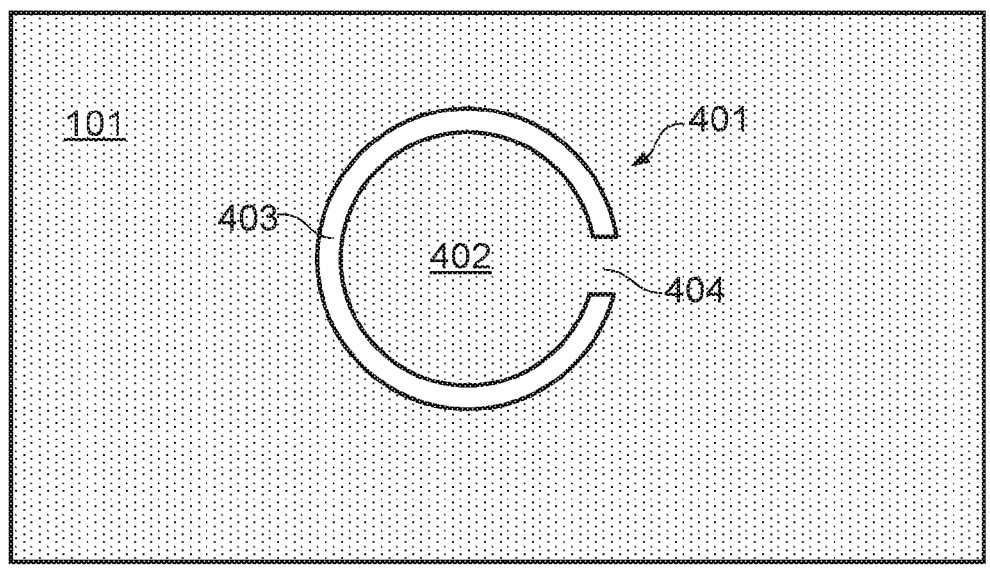
FIGS. 3a-3c illustrate a known variable vent structure.
Figure 3B:
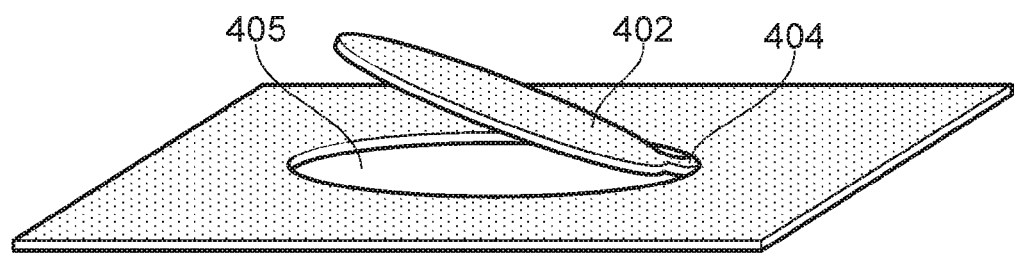
Figure 3C:
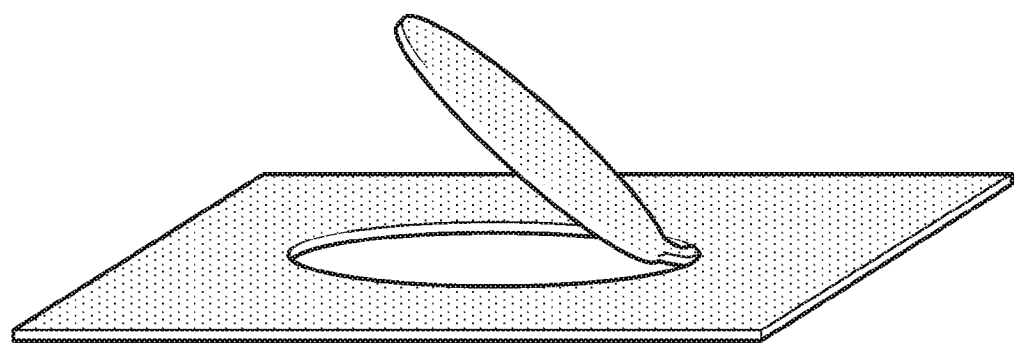
Figure 4A:
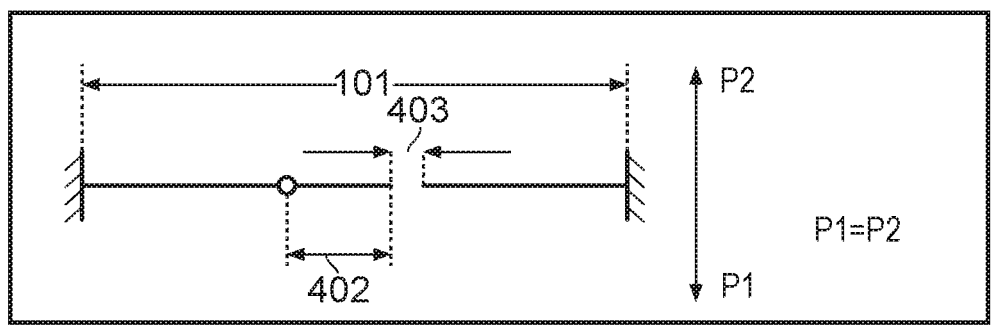
FIG. 4 illustrates a cross section through a MEMS transducer having a vent structure.
Figure 4B:
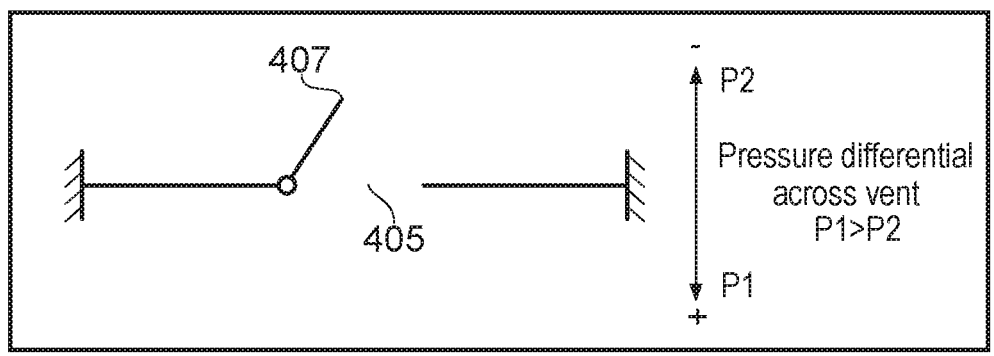

To reduce the likelihood of damage in high pressure situations the transducer structure comprises at least one vent structure in communication with at least one of said first and second volumes. The vent structure comprises at least one moveable portion which is moveable in response to a pressure differential across the vent structure. FIG. 4 illustrates a cross section through a MEMS transducer having such a vent structure. In FIG. 4A there is no pressure differential across the membrane so P1=P2 and the moveable portion 402 is in line with the plane of the membrane 101. The channel or gap 403 defines the moveable portion and, thus, a pair of adjacent edges. The edge 407 of the moveable portion is provided with one or more protrusions and/or recesses. FIG. 4B illustrates the vent structure in circumstances of a differential pressure across the vent in which P1 is greater than P2 such that the moveable portion has been deflected upwardly to reveal the aperture 405.

Figure 5:
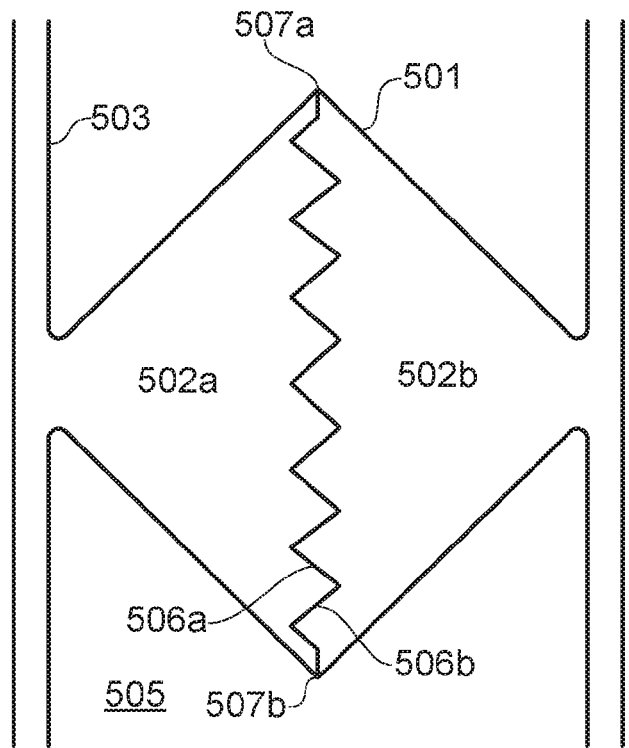
FIG. 5 illustrates a vent structure according to a first embodiment.

FIG. 5 shows a plan view of a vent structure in a substantially closed or equilibrium position according to a first example.

As shown in FIG. 5 the vent structure 501 comprises two moveable portions 502a and 502b. A channel 503 separates the moveable portions from the rest of the flexible membrane 505. The channel also separates the two moveable portions from one another to define first and second adjacent edges 506a and 506b of the first and second moveable portions respectively.

Each of the first and second adjacent edges 506a and 506b exhibits a triangle-wave shape. Thus the first edge 506a can be considered to comprise a plurality of triangular elements which project from the edge surface and are complimentary in shape with a series of triangular elements projecting from the adjacent edge 506b. The region of the first and second adjacent edges can be considered to form an interdigitated region of the vent structure. It will be appreciated that the triangular elements of the first and second moveable portions do not contact each other but are separated by a gap defined by the width of the channel 503. The triangular elements can be considered to form interdigital elements.

Figure 9:
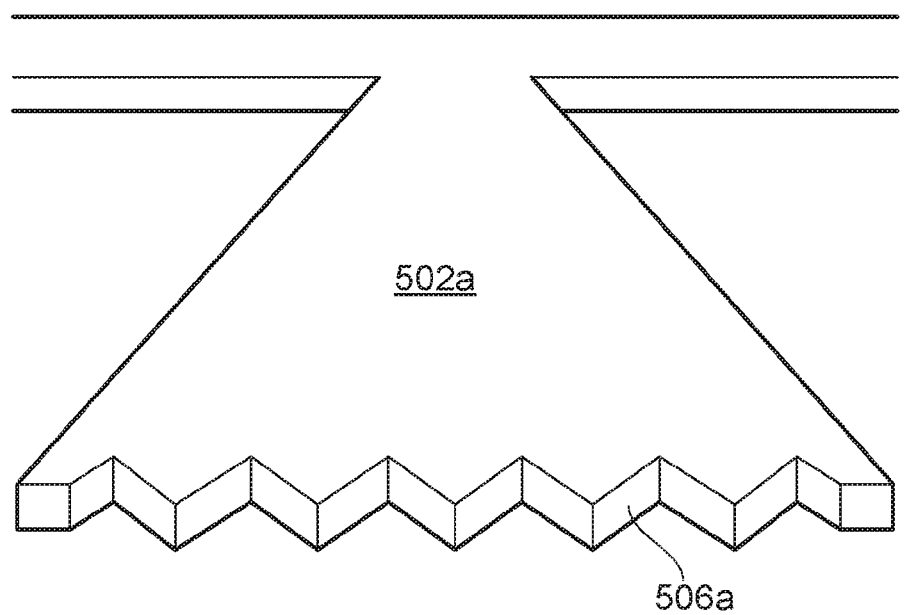
FIG. 9 illustrates an elevational view of one of the internal edges comprised in the embodiment shown in FIG. 5.

The so-called edge length of the edges 506a and 506b can be seen to be longer than the continuous, uninterrupted, distance between the end points of the edge 507a and 507b. In response to a differential pressure across the membrane the moveable portions 502a and 502b will deflect upwardly, or downwardly, away from the plane of the membrane. During the initial stages of this deflection, an extended edge length is provided in the interdigitated region as a result of the discontinuities on the first and second adjacent edges. This extended edge length can be considered to provide a larger vertical surface area on which the resultant force of a pressure differential across the vent will act during the initial stages of the vent structure opening. The extended edge length beneficially increases the initial vent opening speed, therefore allowing a faster pressure equalisation and improving the resilience of the transducer. An elevational view of the edge 506a is shown in FIG. 9.

Figure 6:
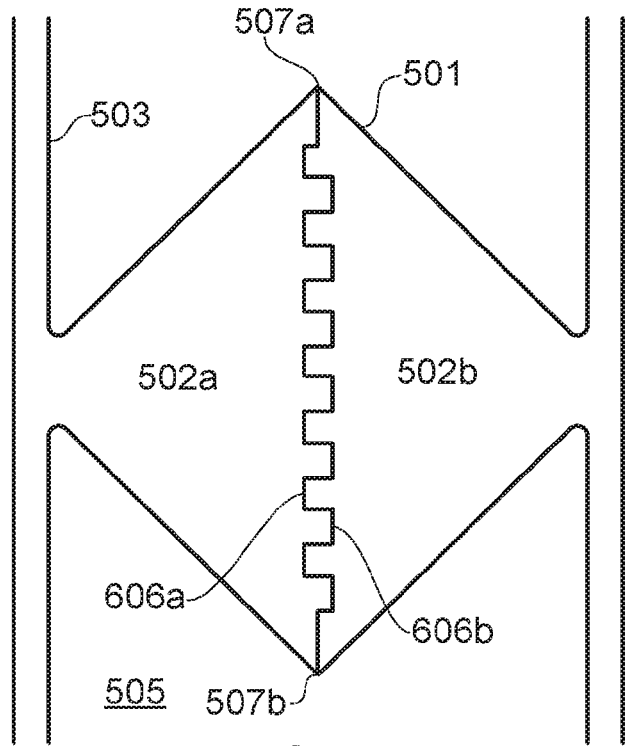
FIG. 6 illustrates a vent structure according to a second embodiment.

FIG. 6 shows a vent structure in a substantially closed or equilibrium position according to a second example.

As shown in FIG. 6 the vent structure 501 again comprises two moveable portions 502a and 502b. A channel 503 separates the moveable portions from the rest of the flexible membrane 505. The channel also separates the two moveable portions from one another to define first and second adjacent edges 606a and 606b of the first and second moveable portions respectively.

Each of the first and second adjacent edges 606a and 606b exhibits a generally square-wave shape. Thus the first edge 606a can be considered to comprise a plurality of square or rectangular elements which project from the edge surface in the plane of the membrane (at equilibrium position) and are complimentary in shape with a series of square or rectangular elements projecting from the adjacent edge 606b. The gap between the first and second adjacent defines an interdigitated region of the vent structure and the square/rectangular elements comprise interdigitated elements.

In this example the edge length of the edges 606a and 606b is even longer than the edge length of the example shown in FIG. 5 and therefore extended even more with respect to the continuous, uninterrupted, distance between end points 507a and 507b. In response to a differential pressure across the membrane the moveable portions 502a and 502b will deflect upwardly, or downwardly, away from the plane of the membrane. During the initial stages of this deflection, an extended edge length is provided as a result of the non-linear edges of the first and second adjacent edges. As explained with reference to the embodiment shown in FIG. 5, this extended edge length provides a larger vertical surface area on which the resultant force of a pressure differential across the vent will act during the initial stages of the vent structure opening.

Figure 7:
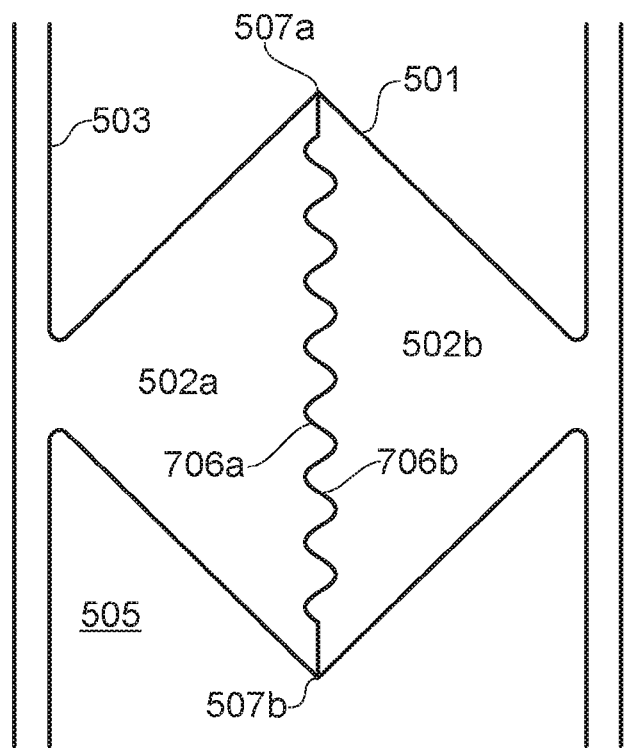
FIG. 7 illustrates a vent structure according to a third embodiment.

FIG. 7 shows a vent structure in a substantially closed or equilibrium position according to a third example.

As shown in FIG. 7 the vent structure 501 again comprises two moveable portions 502a and 502b. A channel 503 separates the moveable portions from the rest of the flexible membrane 505. The channel also separates the two moveable portions from one another to define first and second adjacent edges 706a and 706b of the first and second moveable portions respectively. In this example, each of the first and second adjacent edges 706a and 706b exhibits a generally sinusoidal-wave shape.

In the first, second and third examples, shown in FIGS. 5, 6 and 7 respectively, the protrusions and/or recesses are provided on first and second adjacent edges which overlay the central region of the aperture at equilibrium. In these examples the vent structure has an aperture which is substantially "closed" at equilibrium by a plurality of moveable portions. The moveable portions are connected to the periphery of the aperture and extend towards a central region of the aperture, the edges of the moveable portions effectively tessellating in the plane of the membrane. Considering the vent structure at equilibrium, in this example the central region of the aperture tends to be the region where the moveable portions are furthest from their respective connection to the membrane and thus where the moveable portions exhibit the greatest amount of deflection in response to a differential pressure across the membrane. Thus, it is advantageous for the interdigitated, or complimentary discontinuous, edges of adjacent moveable portions to be provided within this region.

Figure 8:
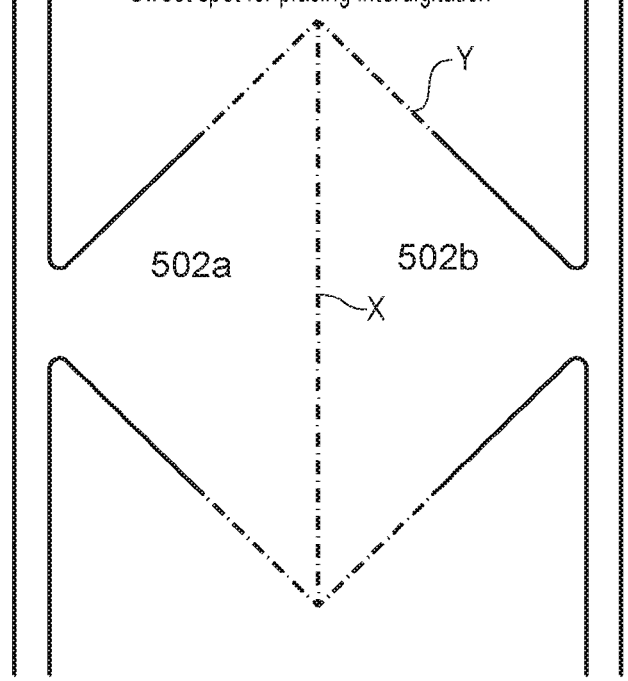
FIG. 8 illustrates possible positions on the vent structure edges for providing one or more protrusions and/or recesses.

FIG. 8 shows a vent structure which is generally the same as the vent structure illustrated in FIGS. 4, 5 and 6. However, in FIG. 8 the detail of the shape of the non-linear edges is not illustrated. Instead, the dashed line of FIG. 8 illustrates the edges of the moveable portions 502a and 502b which may be non-linear, e.g. where protrusions or recesses may be provided. The line X indicates the region where the first and second moveable portions neighbour one another. Thus, line Y indicates a region which is still close to the central region of the aperture where complimentary non-linear edge portions may be provided on the moveable portion and the adjacent edge of the membrane.

Figure 10:
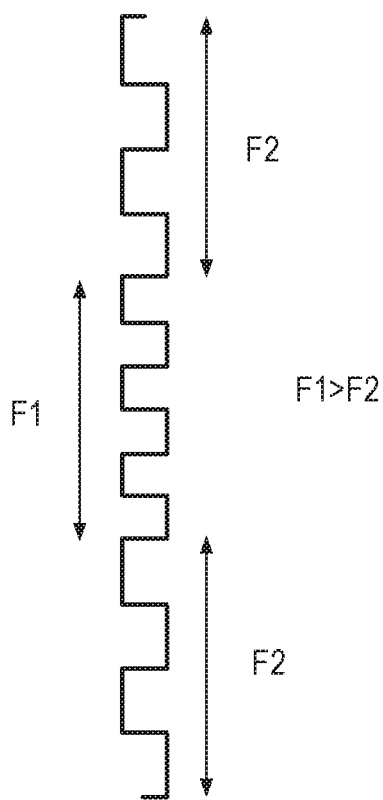
FIG. 10 illustrates the way in which the peak to peak amplitude, or periodicity, of the channel may be varied to change the density of the protrusions and/or recesses.
Figure 11C:
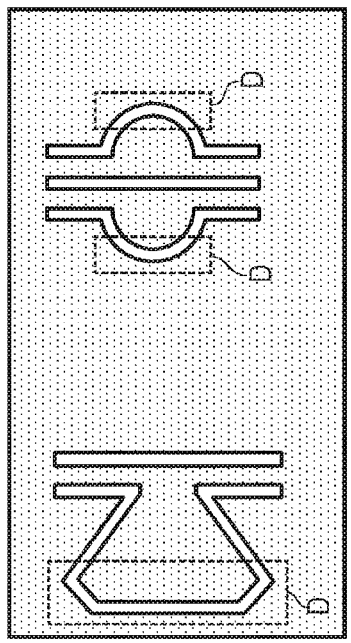
FIG. 11 illustrates various example vent structures.
Figure 11D:
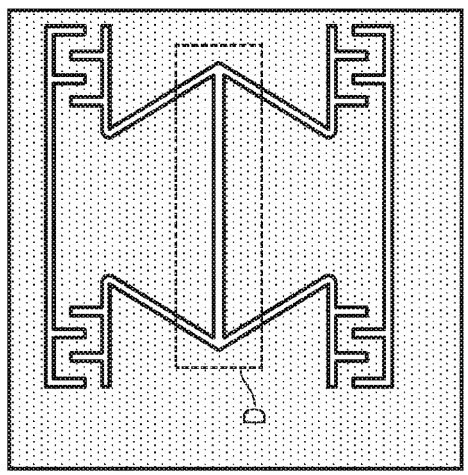
Figure 11A:
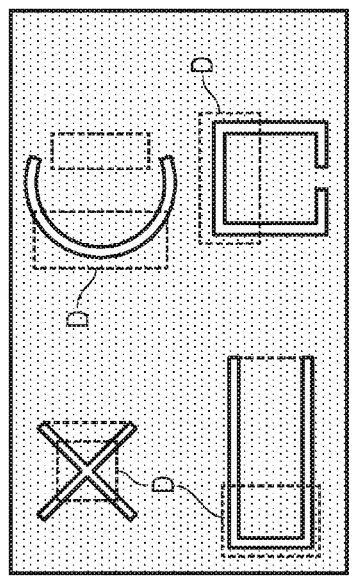
Figure 11B:
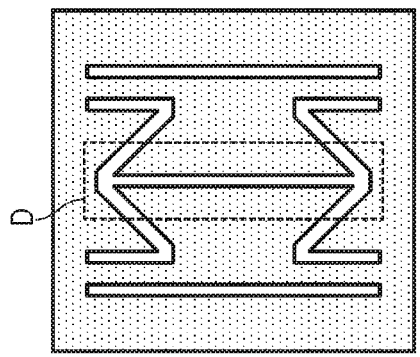

It will be appreciated that embodiments of the present invention may be applied to a variety of different vent structures, for example vent structures having any number of moveable portions, wherein the moveable portions may be of any shape or size. Moreover, the one or more protrusions and/or recesses, or the non-linear edge portions that are formed along one or more edges of the moveable portion may exhibit a variety of different shapes. Furthermore, as shown in FIG. 10, the periodicity of the channel may be varied to change the density of the protrusions and/or recesses. Thus, it is envisaged that the density of protrusions and/or recesses provided on an internal edges may be varied such that the density is higher in a region of most expected deflection (e.g. along the line X in FIG. 8). This arrangement beneficially enhances the non-linear, variable response, of the vent structure.

FIGS. 11a to 11d show a variety of possible example vent structures which may be utilised within the context of embodiments of the present invention. The vent structure designs shown in FIGS. 11a to 11d have been considered in published application US2014/0084396, the entire contents of which is incorporated herein by way of reference thereto. On each of the example vent structures a region, or zone, of most expected deflection has been identified by means of a box bounded by a dashed line D. Thus, any of the internal edges of the membrane that fall within this zone may be advantageously provided with one or more protrusions and/or recesses in order to improve the response time of the vent structure during the initial stages of opening. Indeed, this approach can be fine-tuned in the sense that the density of the protrusions and/or recesses can be varied within the region of most deflection such that the portion of the inner edge which will undergo the most deflection in response to a differential pressure, will exhibit the highest density of protrusions and/or recesses.

Figure 12:
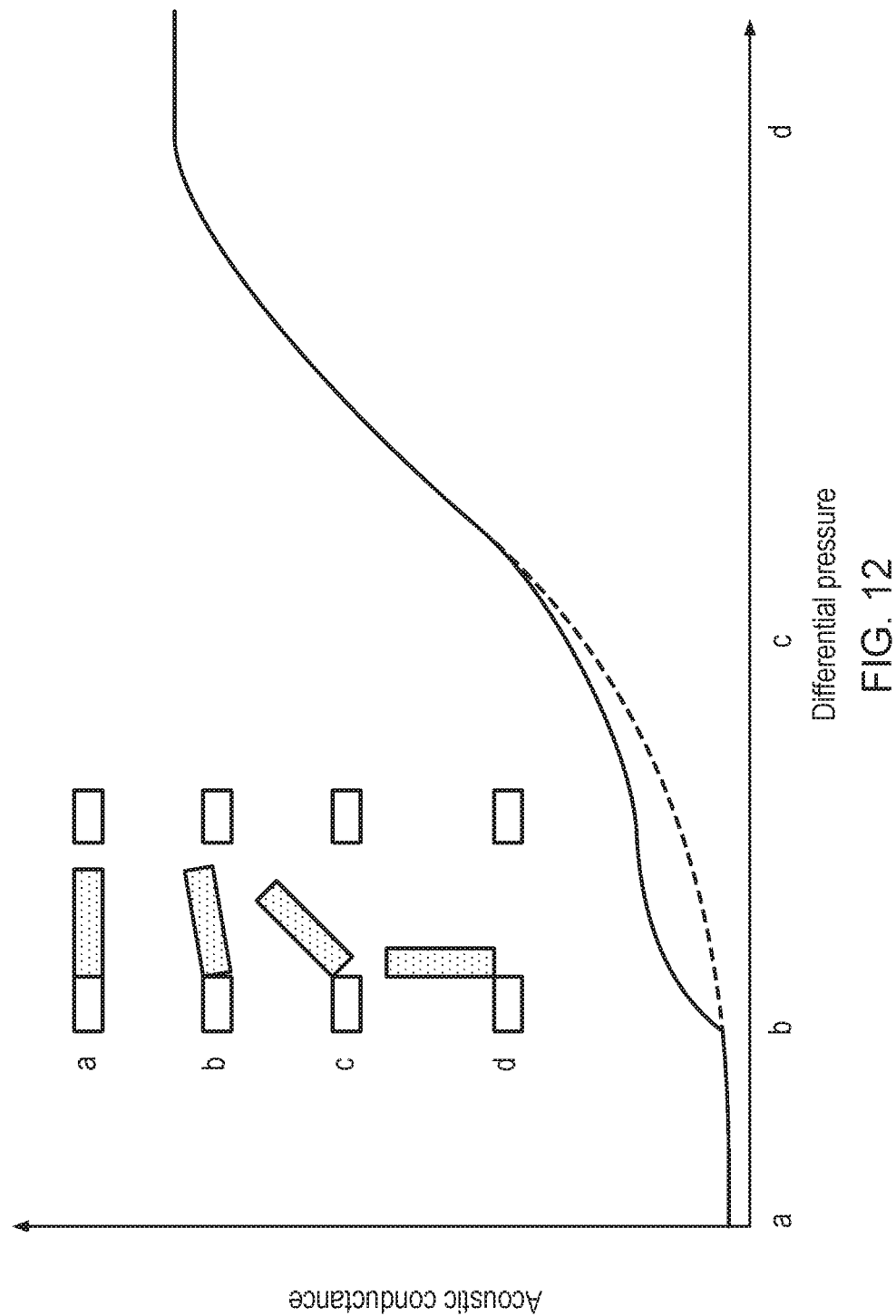
FIG. 12 illustrates a plot of acoustic conductance against pressure differential and the degree of opening of the vent structure.

FIG. 12 illustrates a plot of acoustic conductance against pressure differential and the degree of opening of the vent structure. The acoustic conductance represents how readily air may flow through the membrane in response to a differential pressure. FIG. 12 shows two plots—a solid line which represents the variation in acoustic conductance demonstrated by a MEMS transducer having a plurality of protrusions and/or recesses on an edge of the moveable portion, and a dashed line which represents the variation in acoustic conductance demonstrated by the same MEMS transducer but without any protrusions and/or recesses on the edge of the moveable portion. The position of the moveable portion at differential pressures a, b c and d is shown. Thus, with reference to FIG. 12, during the initial stages of the vent opening—which can be visualised as the moveable portion deflecting from position b to position c—the acoustic conductance as represented by the solid line is seen to increases more rapidly with differential pressure. This can be understood by consideration of the increased surface area on which the resultant force of the pressure differential across the vent will act during the initial stages of the vent structure opening. Once the relevant edge has deflected sufficiently far, out of the flow path through the vent, the acoustic conductance of the vent structure is seen to exhibit a similar profile to the transducer without any protrusions and/or recesses on the edge of the membrane. The extended edge length arising from the provision of the protrusions and/or recesses beneficially increases the initial vent opening speed, therefore allowing a faster pressure equalisation and improving the resilience of the transducer.

Embodiments of the present invention also relate to MEMS transducers comprising a flexible membrane supported between a first volume and a second volume and a vent structure connecting said first and second volumes. The vent provides a flow path having a size that varies with pressure differential across the membrane.

Embodiments of the invention also relate to MEMS transducers having a membrane supported between first and second volumes wherein the acoustic impendence between the first and second volumes is variable with the differential pressure between the volumes.

Although the various embodiments describe a MEMS capacitive microphone, the invention is also applicable to any form of MEMS transducers other than microphones, for example pressure sensors or ultrasonic transmitters/receivers.

Embodiments of the invention may be usefully implemented in a range of different material systems, however the embodiments described herein are particularly advantageous for MEMS transducers having membrane layers comprising silicon nitride.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, laptops, mobile phones, PDAs and personal computers. Embodiments may also be used in voice activated or voice controlled devices. Typical medical applications include hearing aids. Typical industrial applications include active noise cancellation. Typical automotive applications include hands-free sets, acoustic crash sensors and active noise cancellation.

One or more transducers according to the any of the embodiments described above may be incorporated in a package. FIGS. 13a to 13g illustrate various different packaging arrangements. FIGS. 13a to 13g each show one transducer element located in the package but it will be appreciated that in some embodiments there may be more one than transducer, e.g. a transducer array, and the various transducers may be formed on the same transducer substrate, i.e. a monolithic transducer substrate, or may be formed as separate transducers with separate transducer substrates each separate transducer substrate being bonded to a package substrate.

FIG. 13a shows a first arrangement where a transducer 1100 is located in a cover 1101, which forms at least part of a housing, on a package substrate 1102. The cover in this example could be a metallic housing which is bonded to the substrate. The package substrate may comprise at least one insulating layer. The package substrate may also comprise at least one conductive layer. The package substrate may be a semiconductor material or may be formed from a material such as PCB, ceramic or the like. Where the cover 1101 is metallic, or itself comprises a conductive layer, the cover may be electrically coupled to the conductive layer of the substrate, e.g. so that the housing provides shielding for electromagnetic interference (EMI). Bond wires 1103 may connect the transducer to bond pads on the package substrate. In some embodiments, read-out circuitry, for instance amplifier circuitry, may be located within the housing formed in or connected to the package substrate. Through-vias through the package substrate (not illustrated) may connect to contacts, i.e. solder pads, 1104 for electrically connecting external circuitry (not illustrated) to the package to allow transmission of electrical signals to/from the transducer 1100. In the example shown in FIG. 13a there is a sound port or acoustic port in the cover 1101 to allow sound to enter the package and the transducer is arranged in a top port arrangement.

FIG. 13b illustrates an alternative arrangement where the sound port is provided in the package substrate 1102 and may, in use, be sealed. A ring 1105, which may be a sealing ring or a solder pad ring (for use in forming a solder ring) may be provided around the periphery of the sound port on the outer side of the package to allow, in use, sealing of a sound path leading to the sound port when the package is connected to another PCB for example. In this embodiment the transducer is arranged in a bottom port arrangement with the volume defined by the housing 1101 forming part of the back-volume of the transducer.

FIG. 13c illustrates an example where instead of bond wires connecting the transducer to the package substrate the transducer structure is inverted and flip-chip bonded to package substrate via connections 1106. In this example the sound port is in the package substrate such that the package is arranged in a bottom port arrangement.

FIG. 13d illustrates an alternative example to that of FIG. 13b wherein a housing 1107 is formed from various panels of material, for example PCB or the like. In this instance the housing 1107 may comprise one or more conductive layers and/or one or more insulating layers. FIG. 13d shows the sound port in the package substrate. FIG. 13e shows an alternative arrangement to that of FIG. 13b wherein a housing 1107 is formed from various panels of material, for example PCB or the like as described in relation to FIG. 13d. FIG. 13f shows a further embodiment where the transducer structure is bonded via connections 1106 to the housing upper layer, which may for instance be PCB or layered conductive/insulating material. In this example however the electrical connections to the package are still via contacts, solder pads, 1104 on the package substrate, e.g. through-vias (not illustrated) in the package substrate with conductive traces on the inside of the housing to the transducer. FIG. 13g illustrates an alternative example to that of FIG. 13c wherein a transducer is flip-chip bonded to the package substrate in a housing 1107 formed from panels of material, for example PCB or the like as described in relation to FIG. 13d.

In general, as illustrated in FIG. 13h, one or more transducers may be located in a package, the package is then operatively interconnected to another substrate, such as a mother-board, as known in the art.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising: a flexible membrane, the flexible membrane having a vent structure comprising a moveable portion, the vent structure having an equilibrium position at which the moveable portion is substantially in plane with the rest of the membrane, wherein in response to a differential pressure across the vent structure, the moveable portion deflects away from the plane of the membrane to reveal an aperture in the membrane, and wherein at least one edge of the moveable portion comprises one or more protrusions and/or recesses in the plane of the moveable portion.

2. A MEMS transducer as claimed in claim 1, wherein the edge of the moveable portion comprises a first adjacent edge and has a shape that substantially compliments the shape of a second adjacent edge when the vent structure is at the equilibrium position, which second adjacent edge is an adjacent edge of another moveable portion and/or an adjacent edge of the membrane.

3. A MEMS transducer as claimed in claim 2, wherein said first and second adjacent edges are defined by a channel which extends through a membrane.

4. A MEMS transducer as claimed in claim 3, wherein the first and second adjacent edges comprises interdigitated edges.

5. A MEMS transducer as claimed in claim 1, wherein the edge exhibits a sinusoidal, a square-wave, a triangle-wave, or a saw-tooth shape.

6. A MEMS transducer as claimed in claim 1, wherein the edge is serrated.

7. A MEMS transducer as claimed in claim 1, wherein the vent structure comprises a plurality of moveable portions which are connected to the outer periphery of the aperture in the membrane and which border each other at the equilibrium position in the plane of the membrane.

8. A MEMS transducer as claimed in claim 7, wherein first and second edges are provided on two of the plurality of moveable portions.

9. A MEMS transducer as claimed in claim 8, wherein at the equilibrium position the first and second adjacent edges are provided at a region of the moveable portion where the most deflection of the moveable portion is expected in response to a differential pressure across the membrane.

10. A MEMS transducer as claimed in claim 1, wherein the density of the protrusions and/or recesses varies.

11. A MEMS transducer as claimed in claim 10, wherein a higher density of protrusions and/or recesses is provided on an edge within a region of the moveable portion where the most deflection of the moveable portion is expected in response to a pressure differential across the membrane.

12. A MEMS transducer as claimed in the claim 1, wherein the moveable portion of the flexible membrane is defined by one or more channels running through the flexible membrane.

13. A MEMS transducer as claimed in claim 1, wherein each internal edge that is provided with a plurality of protrusions and/or recesses, is an edge of one said moveable portion and/or is an edge of the rest of the membrane.

14. A MEMS transducer as claimed in claim 1, wherein each moveable portion deflects to provide a flow path through the membrane.

15. A MEMS transducer as claimed in claim 1, wherein the vent structure adopts the equilibrium position when the pressure differential across the membrane is negligible, wherein at the equilibrium position the flow path through the vent structure is at a minimum.

16. A MEMS transducer as claimed in claim 1, wherein the flexible membrane is supported between a first volume and a second volume and wherein the flow path is between the first and second volumes.

17. A MEMS transducer as claimed in claim 1, wherein each moveable portion is generally triangular, square or rectangular in shape.

18. A MEMS transducer as claimed in claim 1, wherein said moveable portion is connected to the rest of the flexible membrane via a beam structure.

19. A MEMS transducer as claimed in claim 1, comprising a back-plate structure wherein the flexible membrane is supported with respect to said back-plate structure.

20. A MEMS transducer as claimed in claim 19 wherein said back-plate structure comprises a plurality of holes through the back-plate structure.

21. A MEMS transducer as claimed in claim 1, wherein said transducer comprises a capacitive sensor.

22. A MEMS transducer as claimed in claim 1, wherein said transducer comprises a microphone.

23. A MEMS transducer as claimed in claim 21, further comprising readout circuitry.

24. An integrated circuit comprising a MEMS transducer as claimed in claim 1 and readout circuitry.

25. A MEMS transducer as claimed in claim 1, wherein the transducer is located within a package having a sound port.

26. An electronic device comprising a MEMS transducer as claimed in claim 1.

27. An electronic device as claimed in claim 26 wherein said device is at least one of: a portable device; a battery powered device; an audio device; a computing device; a communications device; a personal media player; a mobile telephone; a games device; and a voice controlled device.

28. A MEMS transducer comprising: a flexible membrane having a vent structure, the vent structure comprising a moveable portion which is separated from the rest of the membrane by a channel which extends through the membrane and defines a pair of adjacent internal edges, wherein at least one of the internal edges is provided with one or more protrusions or recesses.

29. A MEMS transducer as claimed in claim 28, wherein each internal edge that is provided with a plurality of protrusions and/or recesses, is an edge of one said moveable portion and/or is an edge of the rest of the membrane.

30. A MEMS transducer as claimed in claim 28, wherein each moveable portion deflects to provide a flow path through the membrane.

31. A MEMS transducer as claimed in claim 28, wherein the vent structure adopts the equilibrium position when the pressure differential across the membrane is negligible, wherein at the equilibrium position the flow path through the vent structure is at a minimum.

32. A MEMS transducer as claimed in claim 28, wherein the flexible membrane is supported between a first volume and a second volume and wherein the flow path is between the first and second volumes.

33. A MEMS transducer as claimed in claim 28, wherein each moveable portion is generally triangular, square or rectangular in shape.

34. A MEMS transducer as claimed in claim 28, wherein said moveable portion is connected to the rest of the flexible membrane via a beam structure.

35. A MEMS transducer as claimed in claim 28, comprising a back-plate structure wherein the flexible membrane is supported with respect to said back-plate structure.

36. A MEMS transducer as claimed in claim 35 wherein said back-plate structure comprises a plurality of holes through the back-plate structure.

37. A MEMS transducer as claimed in claim 28, wherein said transducer comprises a capacitive sensor.

38. A MEMS transducer as claimed in claim 28, wherein said transducer comprises a microphone.

39. A MEMS transducer as claimed in claim 37, further comprising readout circuitry.

40. An integrated circuit comprising a MEMS transducer as claimed in claim 28 and readout circuitry.

41. A MEMS transducer as claimed in claim 28, wherein the transducer is located within a package having a sound port.

42. An electronic device comprising a MEMS transducer as claimed in claim 28.

43. An electronic device as claimed in claim 42 wherein said device is at least one of: a portable device; a battery powered device; an audio device; a computing device; a communications device; a personal media player; a mobile telephone; a games device; and a voice controlled device.

44. A MEMS transducer comprising: a flexible membrane, the flexible membrane having a vent structure comprising a plurality of moveable portions, wherein in response to a differential pressure across the vent structure, the moveable portions deflect away from the plane of the membrane to reveal an aperture in the membrane, the vent structure having a equilibrium position at which the moveable portions are substantially in plane with the rest of the membrane and at which first and second adjacent edges of two adjacent moveable portions are aligned, wherein the first and second adjacent edges comprise interdigitated edges.

45. A method of fabricating a MEMS transducer having a flexible membrane, the method comprising:
forming a structure having a flexible membrane supported between a first volume and a second volume; and
forming at least one vent structure in communication with at least one of said first and second volumes, comprising forming at least one channel which extends through the membrane to define at least one moveable portion which can be deflected away from the surface of the rest of the flexible membrane in response to a pressure differential, said channel defining a pair of adjacent internal edges, wherein at least one of the internal edges is provided with one or more protrusions and/or recesses in the plane of the membrane.

46. A method as claimed in claim 45 comprising forming a membrane layer to form at least part of said flexible membrane and forming at least one said vent structure in said membrane layer.

* * * * *